(12) United States Patent
Kavousian et al.

(10) Patent No.: US 9,246,435 B1
(45) Date of Patent: Jan. 26, 2016

(54) METHOD TO PRE-CHARGE CRYSTAL OSCILLATORS FOR FAST START-UP

(71) Applicant: QUALCOMM Incorporated, San Diego, CA (US)

(72) Inventors: Amirpouya Kavousian, San Jose, CA (US); Yashar Rajavi, Mountain View, CA (US); Alireza Khalili, Sunnyvale, CA (US); Mohammad Bagher Vahid Far, San Jose, CA (US); Abbas Komijani, Mountain View, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/617,716

(22) Filed: Feb. 9, 2015

(51) Int. Cl.
*H03B 5/06* (2006.01)
*H03B 5/36* (2006.01)
*H03K 3/03* (2006.01)

(52) U.S. Cl.
CPC ............... *H03B 5/06* (2013.01); *H03B 5/362* (2013.01); *H03B 5/364* (2013.01); *H03K 3/0315* (2013.01); *H03B 2200/0094* (2013.01)

(58) Field of Classification Search
CPC ............ H03B 5/06; H03B 5/36; H03B 5/362; H03B 5/364
USPC .................................. 331/116 R, 116 FE, 173
See application file for complete search history.

(56) References Cited

U.S. PATENT DOCUMENTS

| | | | |
|---|---|---|---|
| 6,819,195 B1 * | 11/2004 | Blanchard | H03B 5/06 331/158 |
| 6,903,616 B2 | 6/2005 | Yin et al. | |
| 7,009,458 B2 | 3/2006 | Gazit | |
| 7,439,820 B2 | 10/2008 | Gehring | |
| 7,639,088 B2 | 12/2009 | Shen et al. | |
| 8,413,523 B2 | 4/2013 | Bessho | |
| 2015/0200625 A1 * | 7/2015 | Portmann | H03B 5/06 331/46 |

* cited by examiner

*Primary Examiner* — Ryan Johnson
(74) *Attorney, Agent, or Firm* — Arent Fox LLP

(57) ABSTRACT

A method and apparatus for charging a crystal oscillator are provided. A voltage generating module outputs a ramp voltage signal to a ring oscillator. The ring oscillator generates and outputs a waveform based on the ramp voltage signal. The ramp voltage signal facilitates the ring oscillator to output the waveform at a frequency that varies with time, wherein the varying frequency is within a frequency range of the crystal oscillator. An inverter generates a digital input signal based on the waveform. The digital input signal is sent to an input of the crystal oscillator for charging the crystal oscillator. A feedback module outputs a feedback signal based on the digital input signal, wherein the feedback signal controls the voltage generating module to generate a fixed voltage signal that facilitates the ring oscillator to output the waveform at a frequency that is equal to a resonance frequency of the crystal oscillator.

18 Claims, 5 Drawing Sheets

US 9,246,435 B1

METHOD TO PRE-CHARGE CRYSTAL OSCILLATORS FOR FAST START-UP

BACKGROUND

1. Field

The present disclosure relates generally to communication systems, and more particularly, to an apparatus and method for pre-charging a crystal oscillator.

2. Background

A wireless device (e.g., a cellular phone or a smartphone) may transmit and receive data for two-way communication with a wireless communication system. The wireless device may include a transmitter for data transmission and a receiver for data reception. For data transmission, the transmitter may modulate a transmit local oscillator (LO) signal with data to obtain a modulated radio frequency (RF) signal, amplify the modulated RF signal to obtain an output RF signal having the desired output power level, and transmit the output RF signal via an antenna to a base station. For data reception, the receiver may obtain a received RF signal via the antenna, downconvert the received RF signal with a receive LO signal, and process the downconverted signal to recover data sent by the base station.

The wireless device may include one or more oscillators to generate one or more oscillator signals at one or more desired frequencies. The oscillator signal(s) may be used to generate the transmit LO signal for the transmitter and the receive LO signal for the receiver. The oscillator(s) may be required to generate the oscillator signal(s) to meet the requirements of the wireless communication system with which the wireless device communicates.

Clock generators may receive oscillator signals from an oscillator and may generate clock signals for various modules within the wireless device. The oscillator may be a crystal oscillator, which is typically slow to settle at start-up. Since the wireless device may operate intermittently, additional start-up time may result in additional power being undesirably dissipated. Accordingly, an apparatus and method is needed for pre-charging the crystal oscillator to accelerate start-up.

SUMMARY

In an aspect of the disclosure, a method and an apparatus for charging a crystal oscillator are provided. The apparatus includes at least a voltage generating module, a ring oscillator, an inverter, a feedback module, and/or the crystal oscillator. The voltage generating module outputs a ramp voltage signal to the ring oscillator. The ring oscillator generates and outputs a waveform based on the ramp voltage signal. The ramp voltage signal facilitates the ring oscillator to output the waveform at a frequency that varies with time, wherein the varying frequency is within a frequency range of the crystal oscillator. The inverter generates a digital input signal based on the waveform. The digital input signal is sent to an input of the crystal oscillator for charging the crystal oscillator. The feedback module outputs a feedback signal based on the digital input signal. The feedback signal controls the voltage generating module to generate a fixed voltage signal that facilitates the ring oscillator to output the waveform at a frequency that is equal to a resonance frequency of the crystal oscillator.

DETAILED DESCRIPTION

Figure 1:
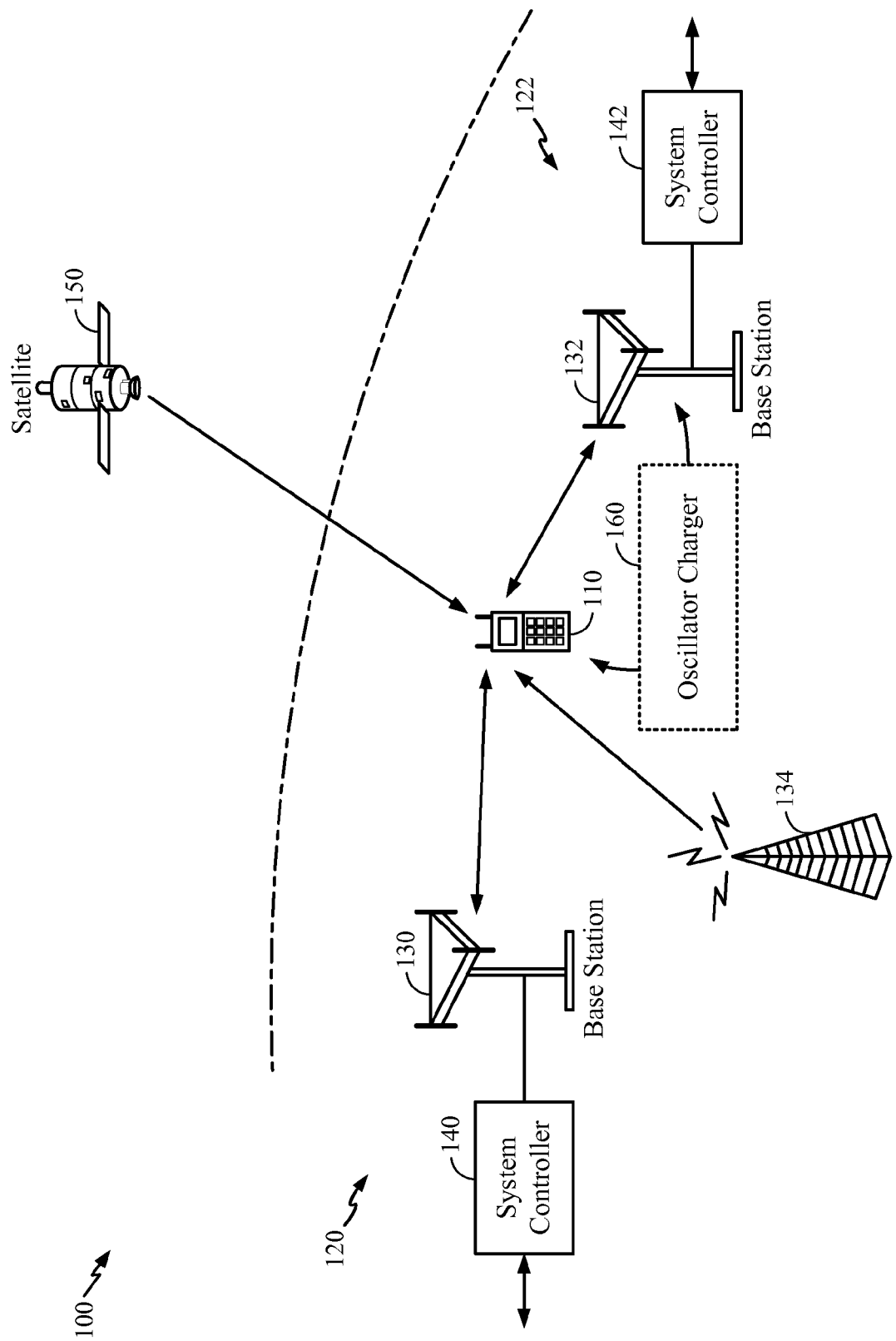
FIG. 1 illustrates a wireless device communicating with different wireless communication systems.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise random-access memory (RAM), read-only memory (ROM), electronically erasable programmable ROM (EEPROM), compact disk (CD) ROM (CD-ROM), or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

FIG. 1 is a diagram 100 illustrating a wireless device 110 communicating with different wireless communication systems 120, 122. The wireless systems 120, 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), CDMA 1x or cdma2000, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). For example, the wireless system 120 may be a GSM system, and the wireless system 122 may be a WCDMA system. As another example, the wireless system 120 may be an LTE system, and the wireless system 122 may be a CDMA system.

For simplicity, the diagram 100 shows the wireless system 120 including one base station 130 and one system controller 140, and the wireless system 122 including one base station 132 and one system controller 142. In general, each wireless system may include any number of base stations and any set of network entities. Each base station may support communication for wireless devices within the coverage of the base station. The base stations may also be referred to as a Node B, an evolved Node B (eNB), an access point, a base transceiver station, a radio base station, a radio transceiver, a transceiver function, a basic service set (BSS), an extended service set (ESS), or some other suitable terminology. The wireless device 110 may also be referred to as a user equipment (UE), a mobile device, a remote device, a wireless device, a wireless communications device, a station, a mobile station, a subscriber station, a mobile subscriber station, a terminal, a mobile terminal, a remote terminal, a wireless terminal, an access terminal, a client, a mobile client, a mobile unit, a subscriber unit, a wireless unit, a remote unit, a handset, a user agent, or some other suitable terminology. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, or some other similar functioning device.

The wireless device 110 may be capable of communicating with the wireless system 120 and/or 122. The wireless device 110 may also be capable of receiving signals from broadcast stations, such as the broadcast station 134. The wireless device 110 may also be capable of receiving signals from satellites, such as the satellite 150, in one or more global navigation satellite systems (GNSS). The wireless device 110 may support one or more radio technologies for wireless communication such as GSM, WCDMA, cdma2000, LTE, 802.11, etc. The terms "radio technology," "radio access technology," "air interface," and "standard" may be used interchangeably.

The wireless device 110 may communicate with a base station in a wireless system via the downlink and the uplink. The downlink (or forward link) refers to the communication link from the base station to the wireless device, and the uplink (or reverse link) refers to the communication link from the wireless device to the base station. A wireless system may utilize TDD and/or FDD. For TDD, the downlink and the uplink share the same frequency, and downlink transmissions and uplink transmissions may be sent on the same frequency in different time periods.

For FDD, the downlink and the uplink are allocated separate frequencies. Downlink transmissions may be sent on one frequency, and uplink transmissions may be sent on another frequency. Some exemplary radio technologies supporting TDD include GSM, LTE, and TD-SCDMA. Some exemplary radio technologies supporting FDD include WCDMA, cdma2000, and LTE. The wireless device 110 and/or the base stations 130, 132 may include an exemplary oscillator charger 160. An exemplary oscillator charger 160 is provided infra.

Figure 2:
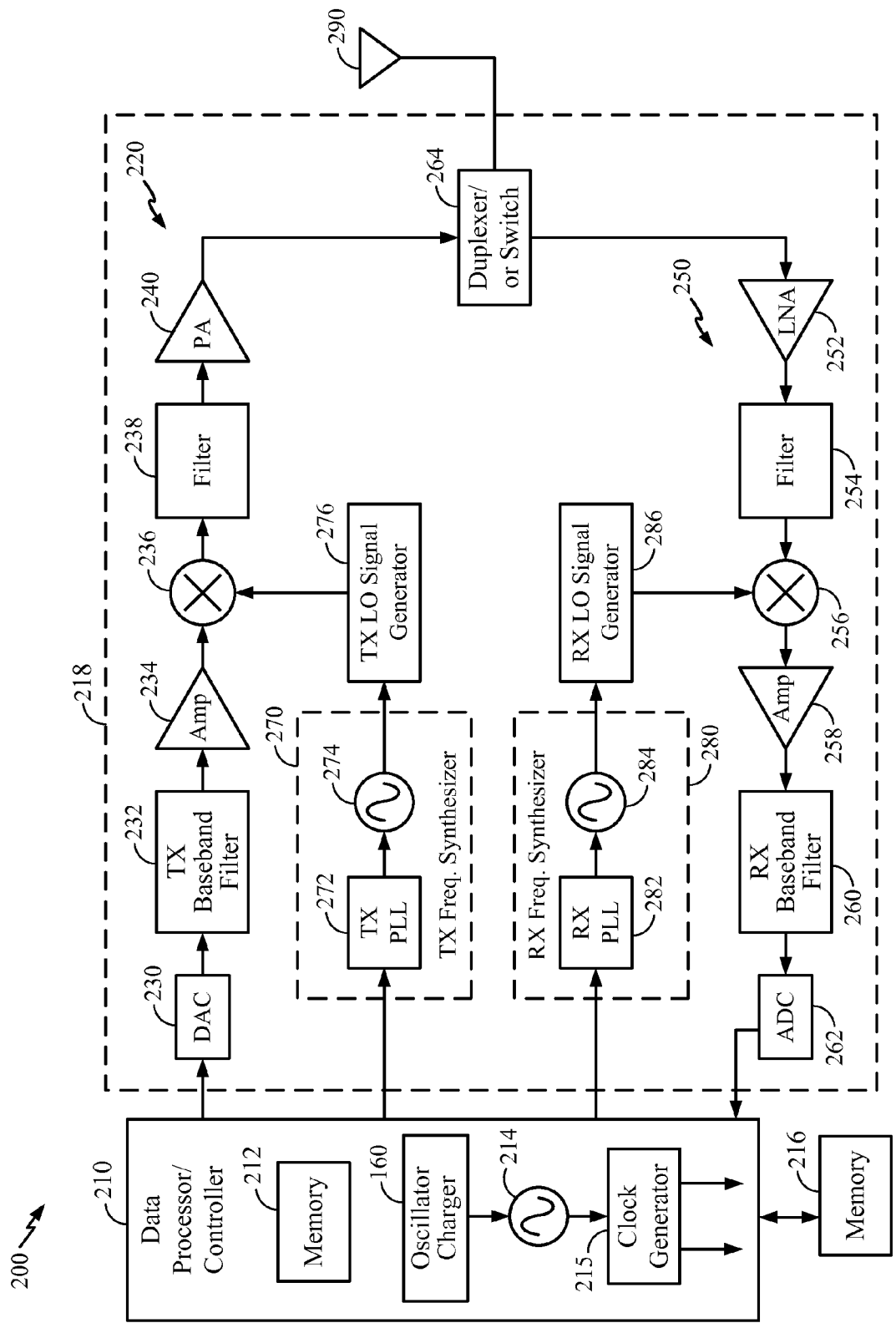
FIG. 2 is a block diagram of a wireless device.

FIG. 2 is a block diagram 200 of an exemplary wireless device, such as the wireless device 110. The wireless device includes a data processor/controller 210, a transceiver 218, and an antenna 290. The data processor/controller 210 may be referred to as a processing system. A processing system may include the data processor/controller 210 or both the data processor/controller 210 and the memory 216. The transceiver 218 includes a transmitter 220 and a receiver 250 that support bi-directional communication. The transmitter 220 and/or the receiver 250 may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary design shown in FIG. 2, the transmitter 220 and the receiver 250 are implemented with the direct-conversion architecture.

In the transmit path, the data processor/controller 210 may process (e.g., encode and modulate) data to be transmitted and provide the data to a digital-to-analog converter (DAC) 230. The DAC 230 converts a digital input signal to an analog output signal. The analog output signal is provided to a transmit (TX) baseband (lowpass) filter 232, which may filter the analog output signal to remove images caused by the prior digital-to-analog conversion by the DAC 230. An amplifier (amp) 234 may amplify the signal from the TX baseband filter 232 and provide an amplified baseband signal. An upconverter (mixer) 236 may receive the amplified baseband signal and a TX LO signal from a TX LO signal generator 276. The upconverter 236 may upconvert the amplified baseband signal with the TX LO signal and provide an upconverted signal. A filter 238 may filter the upconverted signal to remove images caused by the frequency upconversion. A power amplifier (PA) 240 may amplify the filtered RF signal from the filter 238 to obtain the desired output power level and provide an output RF signal. The output RF signal may be routed through a duplexer/switchplexer 264.

For FDD, the transmitter 220 and the receiver 250 may be coupled to the duplexer 264, which may include a TX filter for the transmitter 220 and a receive (RX) filter for the receiver 250. The TX filter may filter the output RF signal to pass signal components in a transmit band and attenuate signal components in a receive band. For TDD, the transmitter 220 and the receiver 250 may be coupled to switchplexer 264. The switchplexer 264 may pass the output RF signal from the transmitter 220 to the antenna 290 during uplink time intervals. For both FDD and TDD, the duplexer/switchplexer 264 may provide the output RF signal to the antenna 290 for transmission via a wireless channel.

In the receive path, the antenna 290 may receive signals transmitted by base stations and/or other transmitter stations and may provide a received RF signal. The received RF signal may be routed through duplexer/switchplexer 264. For FDD, the RX filter within the duplexer 264 may filter the received RF signal to pass signal components in a receive band and attenuate signal components in the transmit band. For TDD, the switchplexer 264 may pass the received RF signal from the antenna 290 to the receiver 250 during downlink time intervals. For both FDD and TDD, the duplexer/switchplexer 264 may provide the received RF signal to the receiver 250.

Within the receiver 250, the received RF signal may be amplified by a low noise amplifier (LNA) 252 and filtered by a filter 254 to obtain an input RF signal. A downconverter (mixer) 256 may receive the input RF signal and an RX LO signal from an RX LO signal generator 286. The downconverter 256 may downconvert the input RF signal with the RX LO signal and provide a downconverted signal. The downconverted signal may be amplified by an amplifier 258 and further filtered by an RX baseband (lowpass) filter 260 to obtain an analog input signal. The analog input signal is provided to an analog-to-digital converter (ADC) 262. The ADC 262 converts an analog input signal to a digital output signal. The digital output signal is provided to the data processor/controller 210.

A TX frequency synthesizer 270 may include a TX phase locked loop (PLL) 272 and a VCO 274. The VCO 274 may generate a TX VCO signal at a desired frequency. The TX PLL 272 may receive timing information from the data processor/controller 210 and generate a control signal for the VCO 274. The control signal may adjust the frequency and/or the phase of the VCO 274 to obtain the desired frequency for the TX VCO signal. The TX frequency synthesizer 270 provides the TX VCO signal to the TX LO signal generator 276. The TX LO signal generator 276 may generate a TX LO signal based on the TX VCO signal received from the TX frequency synthesizer 270.

A RX frequency synthesizer 280 may include an RX PLL 282 and a VCO 284. The VCO 284 may generate an RX VCO signal at a desired frequency. The RX PLL 282 may receive timing information from the data processor/controller 210 and generate a control signal for the VCO 284. The control signal may adjust the frequency and/or the phase of the VCO 284 to obtain the desired frequency for the RX VCO signal. The RX frequency synthesizer 280 provides the RX VCO signal to the RX LO signal generator 286. The RX LO signal generator may generate an RX LO signal based on the RX VCO signal received from the RX frequency synthesizer 280.

The LO signal generators 276, 286 may each include frequency dividers, buffers, etc. The LO signal generators 276, 286 may be referred to as frequency dividers if they divide a frequency provided by the TX frequency synthesizer 270 and the RX frequency synthesizer 280, respectively. The PLLs 272, 282 may each include a phase/frequency detector, a loop filter, a charge pump, a frequency divider, etc. Each VCO signal and each LO signal may be a periodic signal with a particular fundamental frequency. The TX LO signal and the RX LO signal from the LO generators 276, 286 may have the same frequency for TDD or different frequencies for FDD. The TX VCO signal and the RX VCO signal from the VCOs 274, 284 may have the same frequency (e.g., for TDD) or different frequencies (e.g., for FDD or TDD).

The conditioning of the signals in the transmitter 220 and the receiver 250 may be performed by one or more stages of amplifier, filter, upconverter, downconverter, etc. These circuits may be arranged differently from the configuration shown in FIG. 2. Furthermore, other circuits not shown in FIG. 2 may also be used to condition the signals in the transmitter 220 and the receiver 250. For example, impedance matching circuits may be located at the output of the PA 240, at the input of the LNA 252, between the antenna 290 and the duplexer/switchplexer 264, etc. Some circuits in FIG. 2 may also be omitted. For example, the filter 238 and/or the filter 254 may be omitted. All or a portion of the transceiver 218 may be implemented on one or more analog integrated circuits (ICs), RF ICs (RFICs), mixed-signal ICs, etc. For example, the TX baseband filter 232 to the PA 240 in the transmitter 220, the LNA 252 to the RX baseband filter 260 in the receiver 250, the PLLs 272, 282, the VCOs 274, 284, and the LO signal generators 276, 286 may be implemented on an RFIC. The PA 240 and possibly other circuits may also be implemented on a separate IC or a circuit module.

The data processor/controller 210 may perform various functions for the wireless device. For example, the data processor/controller 210 may perform processing for data being transmitted via the transmitter 220 and received via the receiver 250. The data processor/controller 210 may control the operation of various circuits within the transmitter 220 and the receiver 250. The memory 212 and/or the memory 216 may store program codes and data for the data processor/controller 210. The memory may be internal to the data processor/controller 210 (e.g., the memory 212) or external to the data processor/controller 210 (e.g., the memory 216). The memory may be referred to as a computer-readable medium. An oscillator 214 may generate a VCO signal at a particular frequency. In an aspect, the oscillator 214 may be a crystal oscillator. A clock generator 215 may receive the VCO signal (s) from the oscillator 214 and may generate clock signals for various modules within the data processor/controller 210 and/or the transceiver 218. In an aspect, the exemplary oscillator charger 160 is configured to pre-charge the oscillator 214. Pre-charging allows for accelerated start-up of the oscillator 214. In other aspects, the oscillator charger 160 may be configured to pre-charge other oscillators (e.g., VCO 274, VCO 284, etc.) of the transceiver 218. The data processor/controller 210 may be implemented on one or more application specific integrated circuits (ASICs) and/or other ICs.

In an aspect, in a wireless/wireline transceiver, a high-Q (high Q factor) crystal oscillator may provide the reference clock for RF/analog and digital blocks. Due to the high-Q, the crystal oscillator may require a long time to settle at start-up. Because the transceiver may operate intermittently, the additional start-up time caused by the crystal oscillator may undesirably result in extra power being dissipated. Accordingly, the present disclosure provides a method and apparatus for accelerating the settling of the crystal oscillator by assisting with the crystal oscillator's initial phase of energy build-up.

In an aspect, the present disclosure provides an auxiliary oscillator for pumping energy into the crystal oscillator at start-up. The auxiliary oscillator may not need to operate at the same frequency as the crystal oscillator. In an aspect, the auxiliary oscillator may be effective in accelerating the start-up time when the auxiliary oscillator operates at a frequency that is offset hundreds of kilohertz (KHz) from a frequency of the crystal oscillator. The auxiliary oscillator may be a low-power ring oscillator. The auxiliary oscillator may be calibrated once at different temperatures. Moreover, the auxiliary oscillator's tuning parameters may be stored in a lookup table that can be used during subsequent crystal oscillator start-ups.

Figure 3:
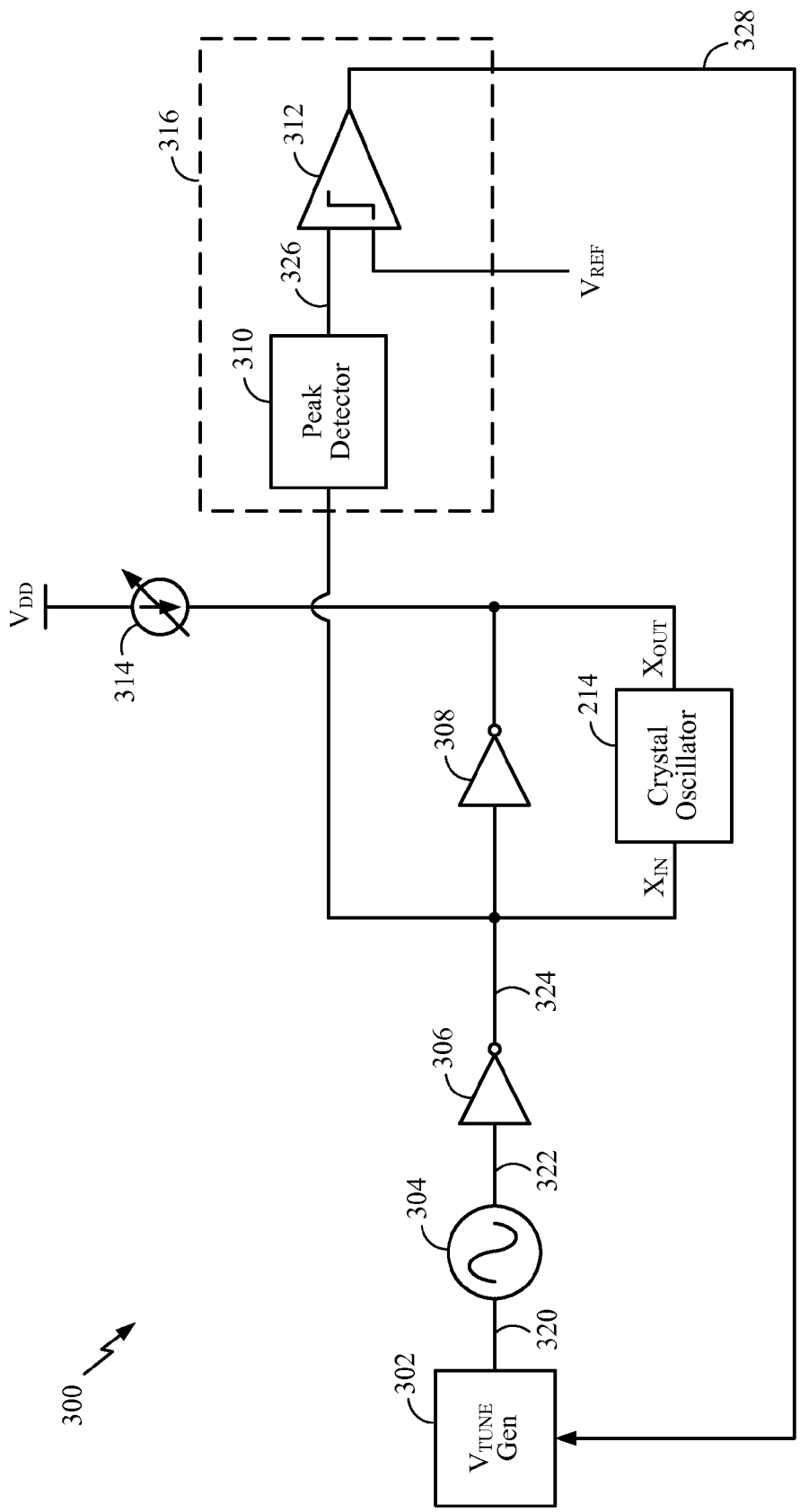
FIG. 3 is a diagram illustrating an apparatus configured to charge a crystal oscillator.

FIG. 3 is a diagram illustrating an apparatus 300 configured to charge the crystal oscillator 214. The apparatus 300 may be equivalent to the oscillator charger 160. In an aspect, the apparatus 300 includes the crystal oscillator 214. However, in other aspects, the crystal oscillator 214 may be a module separate from the apparatus 300. The apparatus 300 may include a voltage generating module or tuning voltage generating ($V_{TUNE}$ Gen) circuit 302, a ring oscillator 304, a first inverter 306, a second inverter 308, a variable current source 314, and a feedback module 316 that operate together to inject a start-up tone into the crystal oscillator 214. The feedback module 316 may include a voltage peak detector 310 and a voltage comparator 312.

In an aspect, the apparatus 300 detects a resonance frequency of the crystal oscillator 214 and injects the start-up tone at the resonance frequency. In particular, the ring oscillator 304 generates the tone for kick-starting the crystal oscillator 214. At start-up, the $V_{TUNE}$ Gen circuit 302 generates a ramp voltage to sweep a frequency of the ring oscillator 304 within a frequency range of the crystal oscillator 214, thus creating a chirp signal at the output of the ring oscillator 304. The chirp signal outputted by the ring oscillator 304 may vary (e.g., increase or decrease) with time. A signal outputted by the ring oscillator 304 may have a frequency matching the resonance frequency when an amplitude of an input signal ($X_{IN}$) swing at the crystal oscillator 214 is at a lowest value. The amplitude of the $X_{IN}$ swing may be detected using the voltage peak detector 310 and the voltage comparator 312 to determine the resonance frequency. After the resonance frequency is determined, the frequency at which the ring oscillator 304 outputs a signal is fixed at the resonance frequency. The ring oscillator 304 will continue charging the crystal oscillator 214 for a specified duration. After the specified duration has elapsed, the ring oscillator 304 is deactivated, buffers will have high-Z (high impedance), and the crystal oscillator 214 will run autonomously.

In more detail, the $V_{TUNE}$ Gen circuit 302 is configured to generate a ramp voltage signal 320 and output the ramp voltage signal 320 to the ring oscillator 304. The ring oscillator 304 is configured to output a waveform (e.g., chirp signal) 322 based on the ramp voltage signal 320. In an aspect, the ramp voltage signal 320 facilitates the ring oscillator 304 to output the waveform 322 at a frequency that varies with time, wherein the varying frequency is within a frequency range of the crystal oscillator 214.

The first inverter 306 is configured to generate a digital input signal 324 based on the waveform 322 received from the ring oscillator 304. The digital input signal 324 is applied to an input ($X_{IN}$) of the crystal oscillator 214 for charging the crystal oscillator 214. Moreover, the digital input signal 324 may be applied to an input of the second inverter 308 and an input of the feedback module 316 (via the peak detector 310), which will be described infra. An output ($X_{OUT}$) of the crystal oscillator 214 may be applied to the clock generator 215 (see FIG. 2). In aspect, the output ($X_{OUT}$) of the crystal oscillator 214 may converge with an output of the second inverter 308 and a signal from the variable current source 314.

The feedback module 316 is configured to generate a feedback signal 328 based on the digital input signal 324 received from the first inverter 306. For example, after receiving the digital input signal 324, the feedback module 316 determines an amplitude of the digital input signal 324. Thereafter, the feedback module 316 outputs the feedback signal 328 when the amplitude of the digital input signal 324 is at a lowest value. The feedback signal 328 is applied to the $V_{TUNE}$ Gen circuit 302. In an aspect, the feedback signal 328 controls the $V_{TUNE}$ Gen circuit 302 to output a fixed voltage signal 320 that facilitates the ring oscillator 304 to output the waveform 322 at a frequency that is equal to a resonance frequency of the crystal oscillator 214. Hence, the ring oscillator 304 is configured to output the waveform 322 at the frequency that is equal to the resonance frequency when the amplitude of the digital input signal 324 is at the lowest value. In an aspect, the ring oscillator 304 outputs the waveform 322 at the frequency that is equal to the resonance frequency for a predetermined time. Moreover, the ring oscillator 304 may be disabled at the end of the predetermined time.

In more detail, the feedback module 316 generates the feedback signal 328 according to operations performed by the voltage peak detector 310 and the voltage comparator 312. For example, the feedback module 316 may receive the digital input signal 324 via the voltage peak detector 310. The voltage peak detector 310 is configured to detect a voltage peak of the digital input signal and output to the voltage comparator 312 a peak voltage signal 326 corresponding to the voltage peak. The voltage comparator 312 is configured to compare the peak voltage signal 326 to a reference voltage ($V_{REF}$) and generate the feedback signal 328 when the peak voltage signal is less than $V_{REF}$. The voltage comparator 312 may then output the feedback signal 328 to the $V_{TUNE}$ Gen circuit 302.

Figure 4:
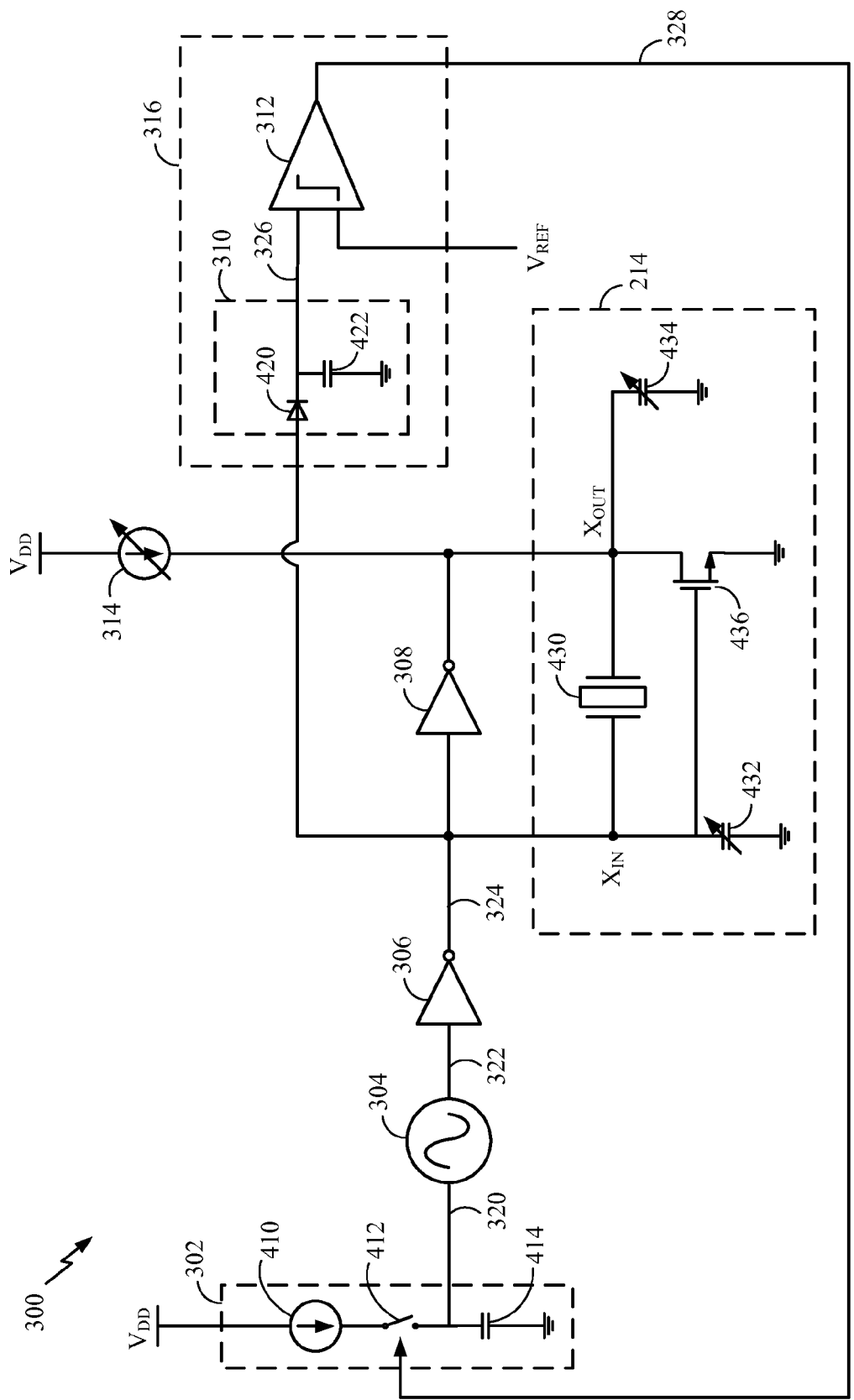
FIG. 4 is an example schematic circuit diagram illustrating an apparatus configured to charge a crystal oscillator.

FIG. 4 is an example schematic circuit diagram illustrating the apparatus 300 configured to charge the crystal oscillator 214. Referring to FIGS. 3 and 4, the $V_{TUNE}$ Gen circuit 302 may include a current source 410, a switch 412, and a capacitor 414. A first end of the switch 412 is coupled to the current source 410. A second end of the switch 412 is coupled to a first terminal of the capacitor 414. A second terminal of the capacitor 414 is coupled to a ground node. In an aspect, the switch 412 is configured to be activated or deactivated based on the feedback signal 328.

As described above, the feedback module 316 may include the voltage peak detector 310 and the voltage comparator 312. In an aspect, the voltage peak detector 310 may include a diode 420 and a capacitor 422. An anode of the diode 420 is coupled to an output of the first inverter 306. A cathode of the diode 420 is coupled to a first input of the voltage comparator 312. A first terminal of the capacitor 422 is coupled to the cathode of the diode 420 and the first input of the voltage comparator 312. A second terminal of the capacitor 422 is coupled to a ground node.

In an aspect, the crystal oscillator 214 may include a crystal 430, a first variable capacitor 432, a second variable capacitor 434, and a transistor 436. A first end of the crystal 430 is coupled to an output of the first inverter 306, a gate of the transistor 436, and a first terminal of the first variable capacitor 432. A second end of the crystal 430 is coupled to the variable current source 314, a drain of the transistor 436, and a first terminal of the second variable capacitor 434. A second terminal of the first variable capacitor 432, a source of the transistor 436, and a second terminal of the second variable capacitor 434 are coupled to a ground node.

In an aspect, the apparatus 300 includes the second inverter 308. An input of the second inverter 308 is coupled to the output of the first inverter 306, the first end of the crystal 430, the gate of the transistor 436, and the first terminal of the first variable capacitor 432. An output of the second inverter 308 is coupled to the variable current source 314, the second end of the crystal 430, the drain of the transistor 436, and the first terminal of the second variable capacitor 434.

Figure 5:
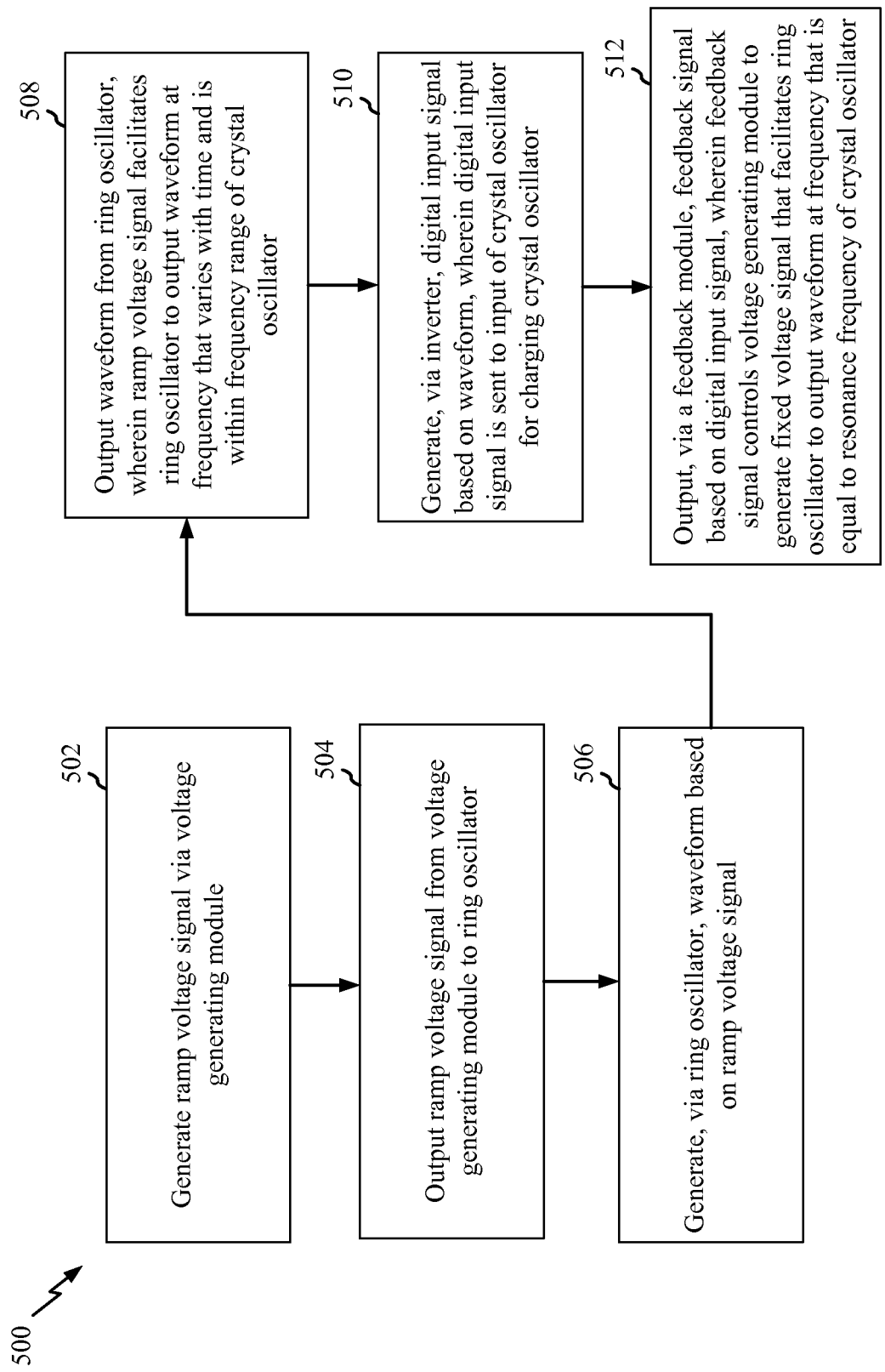
FIG. 5 is a flow chart of a method of charging a crystal oscillator.

FIG. 5 is a flow chart 500 of charging a crystal oscillator. The method may be performed by an apparatus (e.g., oscillator charger 160 or apparatus 300), via one or more of the crystal oscillator 214, the voltage generating module ($V_{TUNE}$ Gen circuit) 302, the ring oscillator 304, the first inverter 306, the second inverter 308, and the feedback module 316 (including the voltage peak detector 310 and the voltage comparator 312).

At block 502, the apparatus generates a ramp voltage signal via the voltage generating module 302. At block 504, the apparatus outputs the ramp voltage signal from the voltage generating module 302 to the ring oscillator 304.

At block 506, the apparatus generates, via the ring oscillator 304, a waveform based on the ramp voltage signal. At block 508, the apparatus outputs the waveform from the ring oscillator 304. In an aspect, the ramp voltage signal facilitates the ring oscillator 304 to output the waveform at a frequency that varies with time (e.g., chirp signal), wherein the varying frequency is within a frequency range of the crystal oscillator 214.

At block 510, the apparatus generates, via the first inverter 306, a digital input signal based on the waveform. The digital input signal is sent to an input of the crystal oscillator 214 for charging the crystal oscillator 214.

At block 512, the apparatus outputs, via a feedback module 316, a feedback signal based on the digital input signal. The feedback signal is outputted to the voltage generating module 302. The feedback signal controls the voltage generating module 302 to generate a fixed voltage signal that facilitates the ring oscillator 304 to output the waveform at a frequency that is equal to a resonance frequency of the crystal oscillator 214.

In an aspect, the feedback module 316 is configured to output the feedback signal by receiving the digital input signal from the first inverter 306, determining an amplitude of the digital input signal, and outputting the feedback signal when the amplitude of the digital input signal is at a lowest value. In a further aspect, the ring oscillator 304 outputs the waveform at the frequency that is equal to the resonance frequency when the amplitude of the digital input signal is at the lowest value.

In an aspect, the feedback module 316 is further configured to output the feedback signal by detecting, via the voltage peak detector 310, a voltage peak of the digital input signal. The voltage peak detector 310 outputs a peak voltage signal corresponding to the voltage peak to the voltage comparator 312. Thereafter, the apparatus compares, via the voltage comparator 312, the peak voltage signal to a reference voltage (e.g., $V_{REF}$). The voltage comparator 312 then outputs the feedback signal when the peak voltage signal is less than the reference voltage.

In an aspect, the ring oscillator 304 outputs the waveform at the frequency that is equal to the resonance frequency for a predetermined time. Moreover, the apparatus may disable the ring oscillator 304 at the end of the predetermined time.

Referring again to FIGS. 3 and 4, an apparatus (e.g., oscillator charger 160 or apparatus 300) may include the crystal oscillator 214, the voltage generating module 302, the ring oscillator 304, the first inverter 306, the second inverter 308, and the feedback module 316 (including the voltage peak detector 310 and the voltage comparator 312). The apparatus includes voltage signal generating means for generating and outputting a ramp voltage signal. The apparatus further includes waveform generating means for generating and outputting a waveform based on the ramp voltage signal, wherein the ramp voltage signal facilitates the waveform generating means to output the waveform at a frequency that varies with time, the varying frequency being within a frequency range of the crystal oscillator. The apparatus also includes inverting means for generating a digital input signal based on the waveform, wherein the inverting means is configured to send the digital input signal to an input of the crystal oscillator for charging the crystal oscillator. The apparatus further includes means for outputting a feedback signal based on the digital input signal, wherein the feedback signal is outputted to the voltage signal generating means, and wherein the feedback signal controls the voltage signal generating means to generate a fixed voltage signal that facilitates the waveform generating means to output the waveform at a frequency that is equal to a resonance frequency of the crystal oscillator. The aforementioned means may be one or more of the crystal oscillator 214, the voltage generating module 302, the ring oscillator 304, the first inverter 306, the second inverter 308, and the feedback module 316 (including the voltage peak detector 310 and the voltage comparator 312), the data processor/controller 210, the computer-readable medium, i.e., the memory 212, and/or the computer-readable medium, i.e., the memory 216 configured to perform the functions recited by the aforementioned means.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus for charging a crystal oscillator, comprising:
    a voltage generating module configured to output a ramp voltage signal;
    a ring oscillator configured to output a waveform based on the ramp voltage signal, wherein the ramp voltage signal facilitates the ring oscillator to output the waveform at a frequency that varies with time, the varying frequency being within a frequency range of the crystal oscillator;
    an inverter configured to generate a digital input signal based on the waveform, wherein the digital input signal is sent to an input of the crystal oscillator for charging the crystal oscillator;
    a feedback module configured to output, based on the digital input signal, a feedback signal to the voltage generating module, wherein the feedback signal controls the voltage generating module to output a fixed voltage signal that facilitates the ring oscillator to output the waveform at a frequency that is equal to a resonance frequency of the crystal oscillator.

2. The apparatus of claim 1, wherein the feedback module is configured to output the feedback signal by:
  receiving the digital input signal;
  determining an amplitude of the digital input signal; and
  outputting the feedback signal when the amplitude of the digital input signal is at a lowest value,
  wherein the ring oscillator outputs the waveform at the frequency that is equal to the resonance frequency when the amplitude of the digital input signal is at the lowest value.

3. The apparatus of claim 2, wherein the feedback module comprises:
  a voltage comparator; and
  a peak detector configured to detect a voltage peak of the digital input signal and output a peak voltage signal corresponding to the voltage peak, the peak detector comprising:
    a diode, wherein an anode of the diode is coupled to an output of the inverter and a cathode of the diode is coupled to a first input of the voltage comparator, and
    a capacitor, wherein a first terminal of the capacitor is coupled to the cathode of the diode and the first input of the voltage comparator, and a second terminal of the capacitor is coupled to a ground node,
  wherein the voltage comparator is configured to compare the peak voltage signal to a reference voltage and output the feedback signal when the peak voltage signal is less than the reference voltage.

4. The apparatus of claim 1, wherein the crystal oscillator comprises:
  a crystal;
  a first variable capacitor;
  a second variable capacitor; and
  a transistor,
  wherein a first end of the crystal is coupled to an output of the inverter, a gate of the transistor, and a first terminal of the first variable capacitor,
  wherein a second end of the crystal is coupled to a current source, a drain of the transistor, and a first terminal of the second variable capacitor, and
  wherein a second terminal of the first variable capacitor, a source of the transistor, and a second terminal of the second variable capacitor are coupled to a ground node.

5. The apparatus of claim 4, further comprising:
  a second inverter,
  wherein an input of the second inverter is coupled to the output of the inverter, the first end of the crystal, the gate of the transistor, and the first terminal of the first variable capacitor, and
  wherein an output of the second inverter is coupled to the current source, the second end of the crystal, the drain of the transistor, and the first terminal of the second variable capacitor.

6. The apparatus of claim 1, wherein the ring oscillator outputs the waveform at the frequency that is equal to the resonance frequency for a predetermined time.

7. The apparatus of claim 6, wherein the ring oscillator is disabled at the end of the predetermined time.

8. The apparatus of claim 1, wherein the voltage generating module comprises:
  a current source;
  a switch configured to be activated or deactivated based on the feedback signal; and
  a capacitor,
  wherein a first end of the switch is coupled to the current source, a second end of the switch is coupled to a first terminal of the capacitor, and a second terminal of the capacitor is coupled to a ground node.

9. A method for charging a crystal oscillator, comprising:
  generating a ramp voltage signal via a voltage generating module;
  outputting the ramp voltage signal from the voltage generating module to a ring oscillator;
  generating, via the ring oscillator, a waveform based on the ramp voltage signal;
  outputting the waveform from the ring oscillator, wherein the ramp voltage signal facilitates the ring oscillator to output the waveform at a frequency that varies with time, the varying frequency being within a frequency range of the crystal oscillator;
  generating, via an inverter, a digital input signal based on the waveform, wherein the digital input signal is sent to an input of the crystal oscillator for charging the crystal oscillator; and
  outputting, via a feedback module, a feedback signal based on the digital input signal, wherein the feedback signal is outputted to the voltage generating module, and wherein the feedback signal controls the voltage generating module to generate a fixed voltage signal that facilitates the ring oscillator to output the waveform at a frequency that is equal to a resonance frequency of the crystal oscillator.

10. The method of claim 9, wherein the outputting the feedback signal comprises:
  receiving the digital input signal;
  determining an amplitude of the digital input signal; and
  outputting the feedback signal when the amplitude of the digital input signal is at a lowest value,
  wherein the ring oscillator outputs the waveform at the frequency that is equal to the resonance frequency when the amplitude of the digital input signal is at the lowest value.

11. The method of claim 10, wherein the outputting the feedback signal further comprises:
  detecting, via a peak detector, a voltage peak of the digital input signal;
  outputting, from the peak detector, a peak voltage signal corresponding to the voltage peak;
  comparing, via a voltage comparator, the peak voltage signal to a reference voltage; and
  outputting the feedback signal from the voltage comparator when the peak voltage signal is less than the reference voltage.

12. The method of claim 9, wherein the ring oscillator outputs the waveform at the frequency that is equal to the resonance frequency for a predetermined time.

13. The method of claim 12, further comprising disabling the ring oscillator at the end of the predetermined time.

14. An apparatus for charging a crystal oscillator, comprising:
  voltage signal generating means for generating and outputting a ramp voltage signal;
  waveform generating means for generating and outputting a waveform based on the ramp voltage signal, wherein the ramp voltage signal facilitates the waveform generating means to output the waveform at a frequency that varies with time, the varying frequency being within a frequency range of the crystal oscillator;
  inverting means for generating a digital input signal based on the waveform, wherein the inverting means is configured to send the digital input signal to an input of the crystal oscillator for charging the crystal oscillator; and means for outputting a feedback signal based on the digital input signal, wherein the feedback signal is outputted to the voltage signal generating means, and wherein the feedback signal controls the voltage signal generating means to generate a fixed voltage signal that facilitates the waveform generating means to output the waveform at a frequency that is equal to a resonance frequency of the crystal oscillator.

15. The apparatus of claim 14, wherein the means for outputting the feedback signal is configured to:

receive the digital input signal;

determine an amplitude of the digital input signal; and output the feedback signal when the amplitude of the digital input signal is at a lowest value, wherein the waveform generating means outputs the waveform at the frequency that is equal to the resonance frequency when the amplitude of the digital input signal is at the lowest value.

16. The apparatus of claim 15, wherein the means for outputting the feedback signal comprises:

means for detecting a voltage peak of the digital input signal, the means for detecting configured to output a peak voltage signal corresponding to the voltage peak; and means for comparing the peak voltage signal to a reference voltage, the means for comparing configured to output the feedback signal when the peak voltage signal is less than the reference voltage.

17. The apparatus of claim 14, wherein the waveform generating means is configured to output the waveform at the frequency that is equal to the resonance frequency for a predetermined time.

18. The apparatus of claim 17, wherein the waveform generating means is disabled from outputting the waveform at the end of the predetermined time.

* * * * *